United States Patent [19] [11] 3,950,142
Brenan et al. [45] Apr. 13, 1976

[54] LEAD ASSEMBLY FOR SEMICONDUCTIVE DEVICE

[75] Inventors: Robert R. Brenan; Robert W. Smith, both of Warren, Pa.

[73] Assignee: GTE Sylvania Incorporated, Stamford, Conn.

[22] Filed: Aug. 5, 1974

[21] Appl. No.: 494,635

Related U.S. Application Data

[63] Continuation of Ser. No. 126,198, March 19, 1971, abandoned.

[52] U.S. Cl. .................. 29/191; 228/208; 29/588; 29/589; 29/590; 357/74; 357/81
[51] Int. Cl.² ........................................ H01L 23/02
[58] Field of Search .......... 29/191, 196.3, 199, 502, 29/588, 589, 590; 357/74, 81

[56] References Cited
UNITED STATES PATENTS

| | | | |
|---|---|---|---|
| 2,373,117 | 4/1945 | Hobrock | 113/112 |
| 2,807,074 | 9/1957 | Schroeder | 29/157.3 |
| 3,422,320 | 1/1969 | Woodling | 317/234 |

Primary Examiner—L. Dewayne Rutledge
Assistant Examiner—E. L. Weise
Attorney, Agent, or Firm—Norman J. O'Malley; Donald R. Castle; Lawrence R. Fraley

[57] ABSTRACT

An improved lead assembly adapted for utilization in a semiconductor device having a glass envelope, an electrical device positioned within said envelope having at least one end surface, said lead assembly comprising a metallic seal member adapted for extending through and bonding to said glass envelope and affixing to said end surface of said electrical device along a first common interface, and a metallic lead member bonded along a second common interface to said metallic seal member, said second common interface located externally of said glass envelope. The improvement comprises providing a secondary path for heat transfer in the form of a substantially uniform copper coating along the entire first common interface between said electrical device and said seal member to thereby facilitate the removal of heat from within said semiconductive device.

11 Claims, 3 Drawing Figures

INVENTORS
ROBERT R. BRENAN &
ROBERT W. SMITH
BY
Donald R. Castle
ATTORNEY

LEAD ASSEMBLY FOR SEMICONDUCTIVE DEVICE

CROSS REFERENCE TO RELATED APPLICATION

This application is a continuation of Ser. No. 126,198, now abandoned, filed Mar. 19, 1971 and assigned to the assignee of the present invention.

BACKGROUND OF THE INVENTION

This invention relates to lead assemblies for electrical devices, and more particularly to lead assemblies for semiconductive devices such as diodes.

Conventional lead assemblies for diode devices are basically comprised of a lead member of specified length having a "slug," or seal member attached thereto. Having a cross-sectional area substantially larger than the lead member, the seal member is the portion of the lead assembly which is later affixed to the diode device and encapsulated in a glass envelope. This method of affixing is most usually by soldering although other methods are possible. Another lead member, which may also have a seal member attached thereto, is joined to the other end of the device before encapsulation, forming a completed crystal diode unit. The crystal diode itself is highly sensitive to heat, thereby making its power rating dependent on the heat dissipating ability of the total unit. Most of the heat is generated within the crystal and must be conducted away primarily by the seal members, or slugs, and the lead members, which act as heat sinks.

Seal members are conventionally cylindrical in shape and it is standard practice in the industry to cut these members from copper-clad wire of nickel-iron composition. A longitudinally sectional view of this cut shows a thin "wipe" of copper across only a portion of the shear surface. This shear surface provides the mounting platform for the device itself, and having only a thin wipe of copper partially there across, substantially reduces the conductivity in this area, as well as the ability of the device to dissipate heat.

It is believed, therefore, that a seal member having a substantially uniform copper coating over its entire surface which forms the first common interface with the electrical device thus providing a secondary path of heat transfer for heat generated within the semiconductive device would be an advancement in the art.

OBJECTS AND SUMMARY OF THE INVENTION

Consequently, it is a primary object of the invention to provide an improved lead assembly for diodes and other electrical devices.

It is a further object of this invention to provide a lead assembly which allows a greater dissipation of heat from these electrical devices during their operation.

A still further object of the invention is to provide a method for making a lead assembly which provides the above cited advantages.

In accordance with one aspect of this invention, there is provided an improved lead assembly for utilization in a semiconductive device having a glass envelope and an electrical device positioned within said envelope having at least one end surface. The lead assembly comprises a metallic seal member having an outer portion adapted for providing a primary path for heat transfer, said seal member further adapted for extending through and bonding to said glass envelope and affixing to said end surface of said electrical device thus forming a first common interface. The lead assembly further comprises a metallic lead member bonded along a second common interface to said metallic seal member. The improvement to the lead assembly comprises the provision of a secondary path for heat transfer in the form of a substantially uniform copper coating along the entire first common interface between said electrical device and said seal member to thereby facilitate the removal of heat from within said semiconductive device.

In accordance with another aspect of this invention there is provided a process for making an improved semiconductive device having a glass envelope, an electrical device positioned within said envelope and having at least one end surface, and at least one lead assembly comprising a metallic seal member having an outer portion thereon adapted for providing a first path of heat transfer, said seal member adapted for extending through and bonding to said glass envelope and affixing to said end surface of said electrical device along a first common interface, and a metallic lead member bonded along a second common interface to said seal member. The process comprises applying a substantially uniform copper coating to said metallic seal member whereby a uniform copper coating will cover the entirety of said first interface between said seal member and said electrical device, metallurgically bonding said metallic seal member to said metallic lead member, said glass envelope, and said end surface of said electrical device.

DESCRIPTION OF THE PREFERRED EMBODIMENTS

For a better understanding of the present invention, together with other and further objects, advantages, and capabilities thereof, reference is made to the following specification and appended claims in connection with the above-described drawings.

Figure 1:
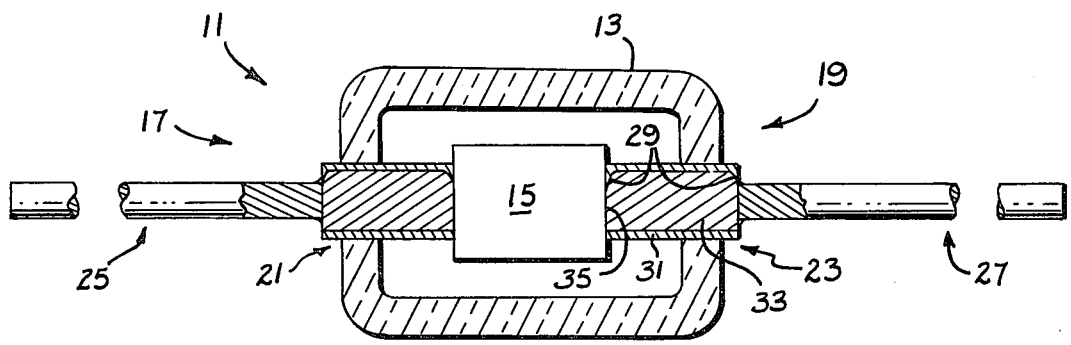
FIG. 1 is a sectional view of a diode unit utilizing lead assemblies of the prior art.

Referring first to FIG. 1, there is shown a prior art diode unit 11 having a glass envelope 13, a standard device 15, and a pair of opposing lead assemblies 17 and 19. Standard device 15 can be any of those typically found in most diode units, a common example being a simple PN junction having a cathode end and an anode end. Diodes of this nature are quite common in the industry and a further description is not necessary here.

Lead assemblies 17 and 19 are typical of those of the prior art in that they each have a seal member, 21 and 23 respectively, which are attached at opposing ends of the device 15. Attached at the other ends of seal members 21 and 23 are lead members 25 and 27 respectively. While FIG. 1 depicts the diode unit as having two seal members, it is not uncommon to construct a diode unit having only one seal member. In this particular case, one of the seal members, 21, for example, could be removed, and lead 25 extended to attach to the device 15.

Conventional methods of making lead assemblies as shown in FIG. 1 have been to cut a seal member from a copper clad wire of a nickel iron alloy and bond it to a lead member having good electrical conduction properties. Illustrative of a suitable alloy for a seal member is one having the composition Fe42Ni with a nominal 22 percent by weight copper coating and referred to in the industry as "dumet." However, cutting this wire has resulted in creating a thin wipe 29 of copper partially across the end surfaces of the seal member, as illustrated in FIG. 1. The copper material 31, which surrounds the nickel-iron composition provides the proper thermal expansion properties and is the primary heat path for dissipating media within the diode envelope during operation. As the device becomes warmer, heat dissipates through copper material 31 to the external environment. The rate of this dissipation is critical, affecting the power rating of the diode unit. While lead assemblies of this type do permit a certain amount of heat removal, their basic construction is somewhat restrictive in that heat generated along the end surface 35 of the device cannot reach the copper material 31 and is either retained within the envelope or is forced into the nickel-iron alloy 33, thereby adversely affecting the conduction properties of the composition.

Figure 2:
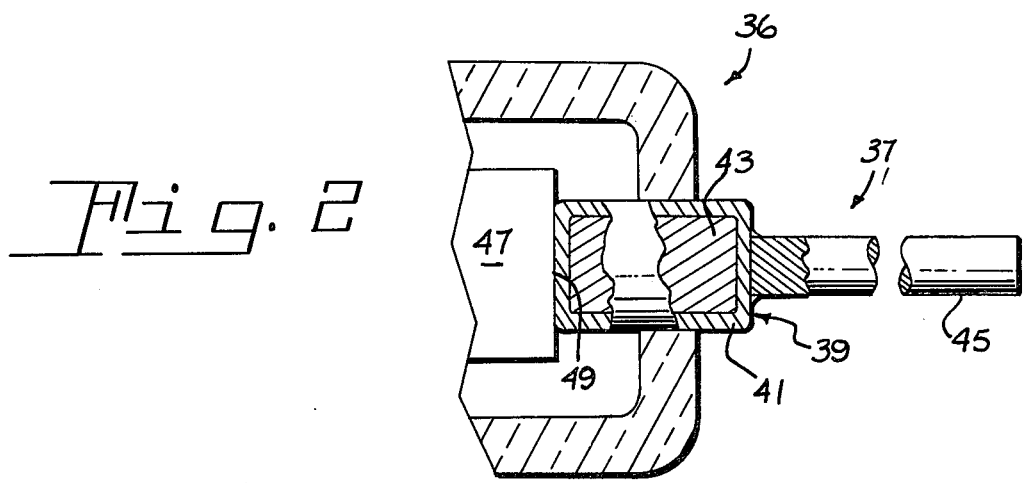
FIG. 2 is a partial sectional view of a lead assembly employing one embodiment of the present invention.

In FIG. 2 can be seen a diode unit 36 employing a lead assembly 37 according to one of the embodiments of the present invention. As shown, the seal member 39 has a substantially uniform copper coating 41 over all external surfaces of the central core material 43. The method of applying copper to this seal member, as well as the lead assembly to be later described in this specification, is electroplating, employing conventional electroplating techniques. This method is not meant to be restrictive however, in that other methods are possible, among these, powder metallurgy and vapor deposition techniques and molten metal dipping. Although it is preferred that core material 43 be of a predetermined composition of nickel and iron, other metallic materials are possible. After having been evenly coated with the copper, seal member 39 is bonded at one end to lead member 45. Welding is preferred as the method for completing this bond although other methods are also possible. The welded slug-lead assembly is next subjected to an accurately controlled heat treatment to affect the desired degassing and produce the proper slug surface conditions.

Once the seal and lead members have been bonded, the next step in constructing the diode unit is to affix the other end of the seal member 39 to the device 47 thus forming a first common interface 49 between member 39 and device 47. The preferred method of securing these units together is soldering, although other means suitable for bonding can be used. Another lead member (not shown) which may or may not have a seal member attached thereto, is affixed at the opposing end of the device and molten glass is used to encapsulate the device and portion of the seal members. After cooling and several subsequent manufacturing operations according to methods known in the industry, the diode unit is complete and ready for use in electrical circuits. It can be seen in FIG. 2 that the substantially even copper coating 41 about core material 43 provides a greater passage for heat escape in the area of first common interface 49 of device 47. In this area, the heat built up may flow much easier along the copper coating and out to the external environment of the unit 36. It must also be understood that the copper, being an excellent current conductor, does not in any way adversely affect the conduction properties of the lead assembly.

Figure 3:
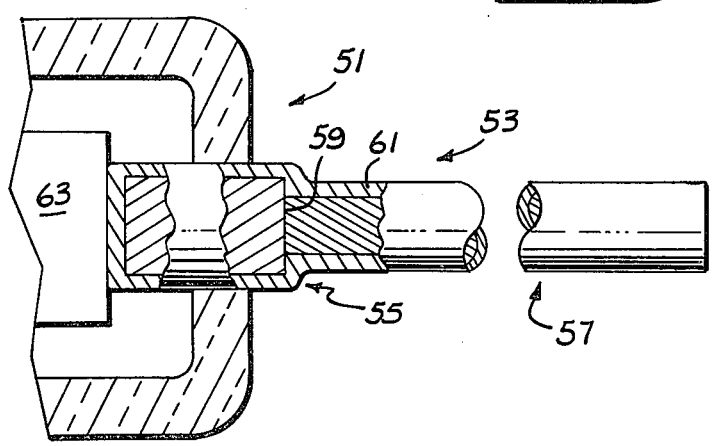
FIG. 3 is a partial sectional view of a lead assembly employing another embodiment of the present invention.

In FIG. 3 can be seen another diode unit 51 employing a lead assembly 53 according to another embodiment of the present invention. This assembly comprises a seal member 55 which has been bonded to lead member 57 along second common interface 59. After completion of this bonding, the entire unit is coated with a substantially uniform covering of copper 61. It is then attached to the device 63, the other lead assembly (not shown) is attached at the opposing end of the device, and encapsulation then occurs. It has been found that by coating the entire lead assembly with copper, the rate of heat dissipation as well as conduction properties, are improved over diode units of the prior art and also those as defined in FIG. 2. While lead assemblies as described in FIGS. 2 and 3 are shown to be cylindrically shaped, this is not an overall restrictive factor concerning electrical units of this nature. It is possible to construct lead assemblies having seal members and lead members employing different cross-sectional structures, such as rectangular or square.

While there have been shown and described what are presently considered the preferred embodiments of this invention, it is obvious to those skilled in the art that various changes and modifications may be made therein without departing from the scope of the invention as defined by the following claims.

We claim:
1. In a lead assembly adapted for utilization in a semiconductive device having a glass envelope and an electrical device positioned within said envelope having at least one end surface, said lead assembly comprising a metallic seal member having an outer portion adapted for providing a first path of heat transfer, said seal member further adapted for extending through and bonding to said glass envelope and affixing to said end surface of said electrical device along a first common interface, and a metallic lead member bonded along a second common interface to said metallic seal member, said second common interface located externally of said glass envelope, the improvement comprising:
 providing a substantially uniform copper coating along the entirety of said first common interface between said electrical device and said seal member to provide a second path for heat transfer and thereby facilitate the removal of heat from within said semiconductive device, said copper coating not providing a bond between said electrical device and said seal member.

2. The improvement according to claim 1 wherein the core material for said seal member is of a nickel and iron composition.

3. The improvement according to claim 1 wherein the method for providing said uniform copper coating along said first common interface between said metallic seal member and said electrical device is electroplating.

4. The improvement according to claim 1 further including a third path of heat transfer in the form of a substantially uniform copper coating along the entirety of said second common interface between said seal member and said lead member.

5. The improvement according to claim 1 further including a substantially uniform copper coating along the entirety of said lead member to thereby further facilitate removal of heat from said semiconductive device.

6. A process for making an improved semiconductive device having a glass envelope, an electrical device positioned within said envelope and having at least one end surface, and at least one lead assembly comprising a metallic seal member having an outer portion adapted for providing a first path of heat transfer, said metallic seal member further adapted for extending through and bonding to said glass envelope and affixing to said end surface of said electrical device along a first common interface, and a metallic lead member bonded along a second common interface to said seal member, said second common interface located externally of said glass envelope, said process comprising:

applying a substantially uniform copper coating to the external surface of said metallic seal member; and thereafter metallurgically bonding said metallic seal member to said metallic lead member, said glass envelope, and said end surface of said electrical device whereby said substantially uniform copper coating will be located along the entirety of said first common interface between said seal member and said end surface of said electrical device to thereby facilitate removal of heat from said semiconductive device, said copper coating not providing a bond between said seal member and said electrical device.

7. The process according to claim 6 wherein the method for applying said substantially uniform copper coating to said metallic seal member is electroplating.

8. The process according to claim 7 further including the step of applying a substantially uniform copper coating to said metallic seal member whereby a substantially uniform copper coating will be positioned along the entirety of said second common interface between said seal member and said lead member to further facilitate removal of heat from said semiconductive device.

9. The process according to claim 6 further including the step of applying a substantially uniform copper coating along the entirety of the external surface of said lead member to thereby facilitate removal of heat from said semiconductive device.

10. The process according to claim 8 wherein the method for applying said copper coating is electroplating.

11. The process according to claim 9 wherein the method for applying said copper coating is electroplating.

* * * * *